(12) United States Patent
Ahmad

(10) Patent No.: US 9,281,683 B1
(45) Date of Patent: Mar. 8, 2016

(54) ELECTROSTATIC DISCHARGE PROTECTION AND METHOD IN POWER SUPPLY

(71) Applicant: La-Z-Boy Incorporated, Monroe, MI (US)

(72) Inventor: Tahir Ahmad, Dundee, MI (US)

(73) Assignee: La-Z-Boy Incorporated, Monroe, MI (US)

( * ) Notice: Subject to any disclaimer, the term of this patent is extended or adjusted under 35 U.S.C. 154(b) by 0 days.

(21) Appl. No.: 14/631,311

(22) Filed: Feb. 25, 2015

(51) Int. Cl.
*H02M 3/335* (2006.01)
*H02H 9/04* (2006.01)

(52) U.S. Cl.
CPC .......... *H02H 9/046* (2013.01); *H02M 3/33507* (2013.01)

(58) Field of Classification Search
CPC ............................ H02H 9/046; H02M 3/33507
See application file for complete search history.

(56) References Cited

U.S. PATENT DOCUMENTS

| | | | |
|---|---|---|---|
| 5,555,150 A * | 9/1996 | Newman, Jr. | 361/56 |
| 5,995,353 A * | 11/1999 | Cunningham et al. | 361/111 |
| 6,002,569 A * | 12/1999 | Horvath | 361/111 |
| 6,781,326 B2 * | 8/2004 | Stack | 315/291 |
| 8,345,400 B2 * | 1/2013 | Veskovic | 361/118 |
| 2010/0039838 A1 | 2/2010 | Carpenter | |
| 2010/0073834 A1 | 3/2010 | Troemel, Jr. et al. | |

FOREIGN PATENT DOCUMENTS

| | | |
|---|---|---|
| JP | 2011/206160 A | 10/2011 |
| JP | 2012/043860 A | 3/2012 |
| KR | 1993-0015247 B1 | 12/1993 |

OTHER PUBLICATIONS

International Search Report and Written Opinion of the International Searching Authority for PCT/US2015/017761 mailed Sep. 30, 2015.

* cited by examiner

*Primary Examiner* — Jue Zhang
(74) *Attorney, Agent, or Firm* — Harness, Dickey & Pierce, P.L.C.

(57) ABSTRACT

The switched mode power supply and method has respective AC circuit and DC circuit portions, each having their own respective grounds. To each of these respective grounds an attachment point providing an energy pathway to ground is defined. A spark gap structure, coupled between the attachment points, substantially inhibits the flow of direct current between the attachment points while providing a static electricity energy path between the attachment points. The spark gap structures may be implemented by circuit board traces, by electronic circuit component leads, by spaced apart structures such as heat sinks or by other discharging components. In this way the power supply does not need to rely on an earth ground in order to protect against damage due to electrostatic discharge.

25 Claims, 10 Drawing Sheets

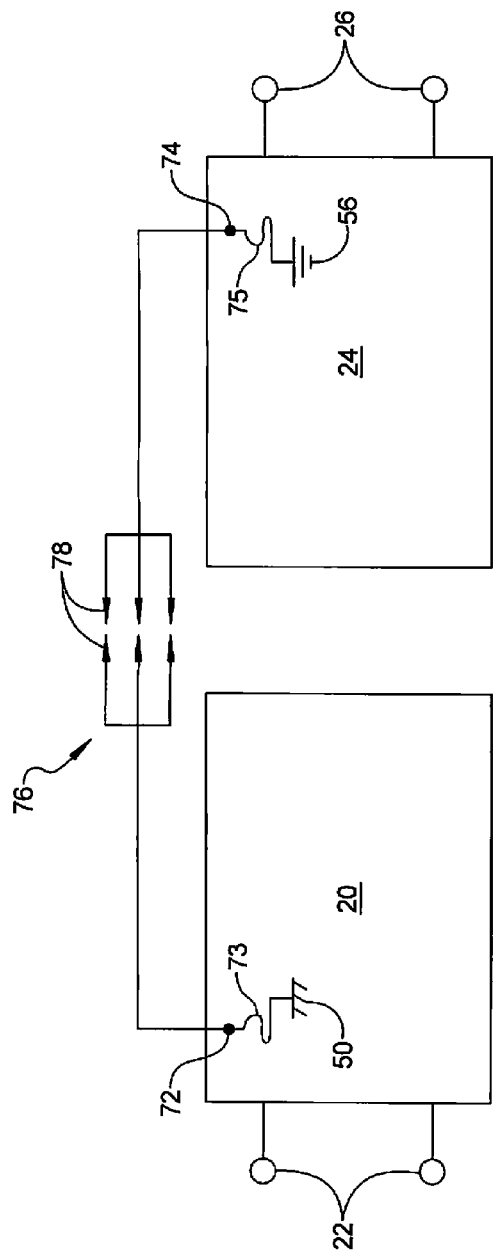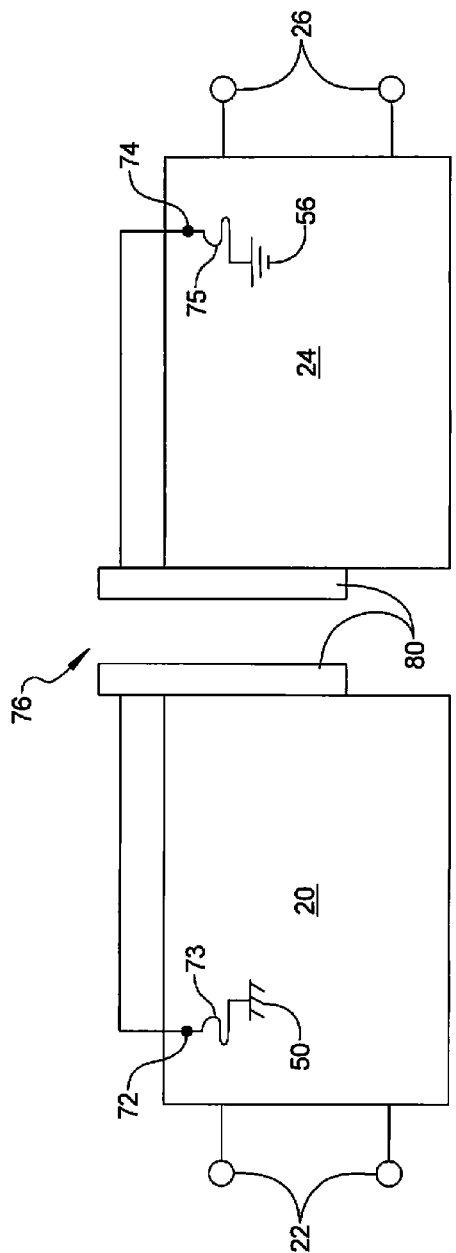

ELECTROSTATIC DISCHARGE PROTECTION AND METHOD IN POWER SUPPLY

FIELD

The present disclosure relates generally to power supplies for electrical and electronic equipment. More particularly the disclosure relates to protective circuit configurations to minimize the damaging effects of electrostatic discharges in power supplies and associated electronics to which those power supplies are coupled. The disclosed protective circuits are useful in a variety of applications and shown here in conjunction with electrically powered furniture such as lift chairs and recliners.

BACKGROUND

This section provides background information related to the present disclosure which is not necessarily prior art.

Electrostatic discharge (ESD) is a common and troublesome phenomena observed in dry conditions. When a person walks across a carpet or gets into our out of an upholstered chair, for example, the static generated can reach as high as 18 kv. This static electricity can travel from the person or furniture to electronic devices, particularly those having a power supply connected to an AC outlet. When the outlet is grounded using a three-prong plug, the static discharge can usually be diverted around any delicate electronic components so that minimal damage is observed. The third prong is connected to an earth ground that acts as the least resistance path for discharge of the static electricity. However, when the device employs a power supply or charger that does not feature a grounded three-prong plug, the static discharge can run rampant through delicate electronic components, causing damage to the electronic device and its power supply.

While the grounded outlet and three-prong plug would seemingly solve the electrostatic discharge problem, not all homes and buildings are equipped with this feature. Moreover, there are many electronic devices that do not have a three-prong plug. In these instances, the electronic devices are prone to damage due to electrostatic discharge.

SUMMARY

This section provides a general summary of the disclosure, and is not a comprehensive disclosure of its full scope or all of its features.

In the disclosed solution, no earth ground is required for the electrostatic discharge in this method. The ESD from the DC output of the power supply that comes from the device connected to the power supply is safely discharged to the AC line without going through any sensitive electronic components inside the power supply via a spark gap structure having discharge pins or other structural separation between two or more conductive surfaces coupled between the respective the DC and the AC sides of the power supply.

The spark gap or discharge pin(s) may be created on the printed circuit board, between the DC side and the AC side of the power supply. The structurally separated conductive surfaces can be made or created on the printed circuit board as well. On the DC output terminals the spark gap or the discharge pin(s) or conductive surfaces can be connected to the (+) positive terminal or the (−) negative terminal, or both; or to any other suitable reference point(s) on the DC side. The other side of the spark gap or discharge pin(s) or conductive surfaces are connected to the AC side, such as to the live (hot) terminal or the neutral terminal, or both; or to any other suitable reference point(s) on the AC side of the printed circuit board.

The spark gap or discharge pin(s) or conductive surfaces can be any number of surfaces from one surface to any number of surfaces. The gap or distance between the spark gap or discharge pin(s) or conductive surfaces are adjusted to a minimum distance acceptable by the compliance agency for the separation between the AC and DC components. In this way the AC and DC sides of the power supply remain electrically isolated (AC line voltage does not flow to the DC side), yet electrostatic energy is conducted from the DC side to the AC side through a path that does not damage the electronic components of the power supply.

In accordance with one aspect, a power supply is provided for converting alternating current (AC) into direct current (DC) for powering a device. The power supply includes an AC circuit adapted for coupling to a source of alternating current and having a first common reference point (AC reference point) such an AC ground, an AC neutral or an AC hot terminal; and a DC circuit coupled to the AC circuit and providing direct current terminals for coupling to the powered device and having a second common reference point (DC reference point), such as a DC positive terminal, a DC negative terminal or a DC ground. The AC and DC grounds are electrically isolated to substantially inhibit the flow of direct current there between (and consequently to inhibit the flow of AC line voltage to the DC side). A first attachment point provides an energy pathway to the AC reference point, while a second attachment point provides an energy pathway to the DC reference point. In this way, damaging electrostatic charges are diverted around the delicate components of the power supply.

A spark gap structure is coupled to the first and second attachment points. This spark gap structure is configured to substantially inhibit the flow of direct current between the first and second attachment points while providing a static electricity energy path between the first and second attachment points.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 7 is a simplified block diagram of a power supply employing a first embodiment of the protective spark gap structure;

FIG. 8 is a simplified block diagram of a power supply employing a first embodiment of the protective spark gap structure;

Corresponding reference numerals indicate corresponding parts throughout the several views of the drawings.

DETAILED DESCRIPTION

Example embodiments will now be described more fully with reference to the accompanying drawings.

The electrostatic discharge protection technique will be described here in connection with two typical use cases: a motorized chair that uses a DC power supply to energize the motors and controller circuits, and a laptop computer that uses a DC power supply to charge the internal battery and to provide operating power to the laptop. These are exemplary devices as the circuits disclosed here may be applicable to other types of devices powered by a DC power supply that is ordinarily plugged into an AC outlet when in use.

Figure 1:
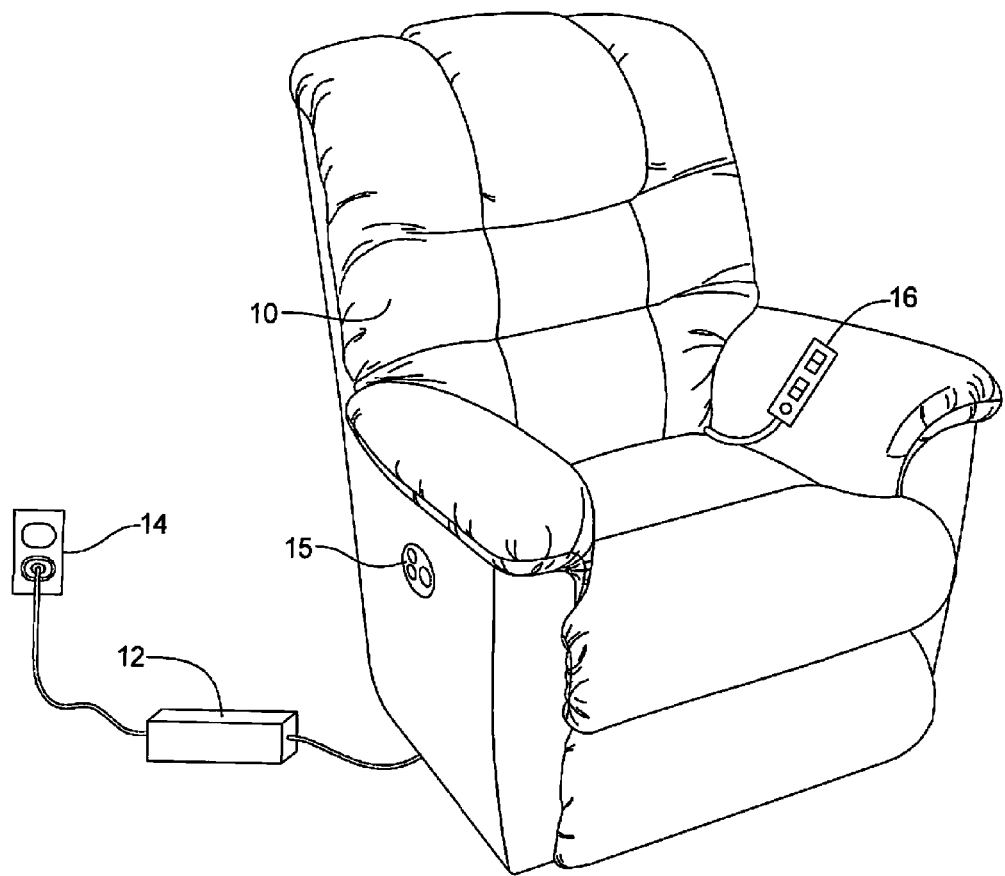
FIG. 1 is a perspective view of an exemplary recliner chair having an motorized recliner features, illustrating how the power supply may be deployed.

Referring to FIG. 1, an exemplary power assisted recliner chair 10. Chair 10 is also exemplary of an electrically operated lift chair, a primary difference between recliner chairs and lift chairs being the respective range of motor assisted motions. Power to operate the motors and other electrical and electronic components of chair 10 is derived from a DC power supply 12 that is in turn coupled to a source of alternating (AC) current, such as an AC wall outlet 14. Chair 10 may be provided with a controller 15, mounted on an arm of the chair. The controller 15 is powered by the power supply and provides control voltages that power internal motors (not shown) that adjust the seat back and leg rest portions of the chair. As an alternative to, or in addition to the arm-mounted controller 15, a detachable controller 16 may be provided. Controller 16 functions essentially the same as controller 15, but is attached to the internal electronic components via an umbilical cord as illustrated. As a third alternative, the internal electronic components of the chair can include a radio circuit compatible with Bluetooth or WiFi protocols, to allow the char to be controlled remotely from a handheld portable device, such as a smartphone or tablet computer.

Power supply 12 is preferably a switched mode power supply. Switched mode power supplies convert the standard 60 Hz. (or 50 Hz. in some locations) AC power into an alternating current of higher frequency. This is typically done with a solid state device such as a switching transistor. By converting the standard AC power to a higher frequency, much smaller step down transformers can be used, thus resulting in a much smaller and more convenient power supply package that is better suited for consumer applications. Once the voltage of this higher frequency alternating current has been stepped down to a voltage compatible with the DC motors and controller circuits, the lower voltage is rectified to convert it to the desired DC voltage. Thus the switched mode power supply has an AC portion, on the primary side of the step down transformer, and a DC portion, on the secondary side of the step down transformer.

Figure 2:
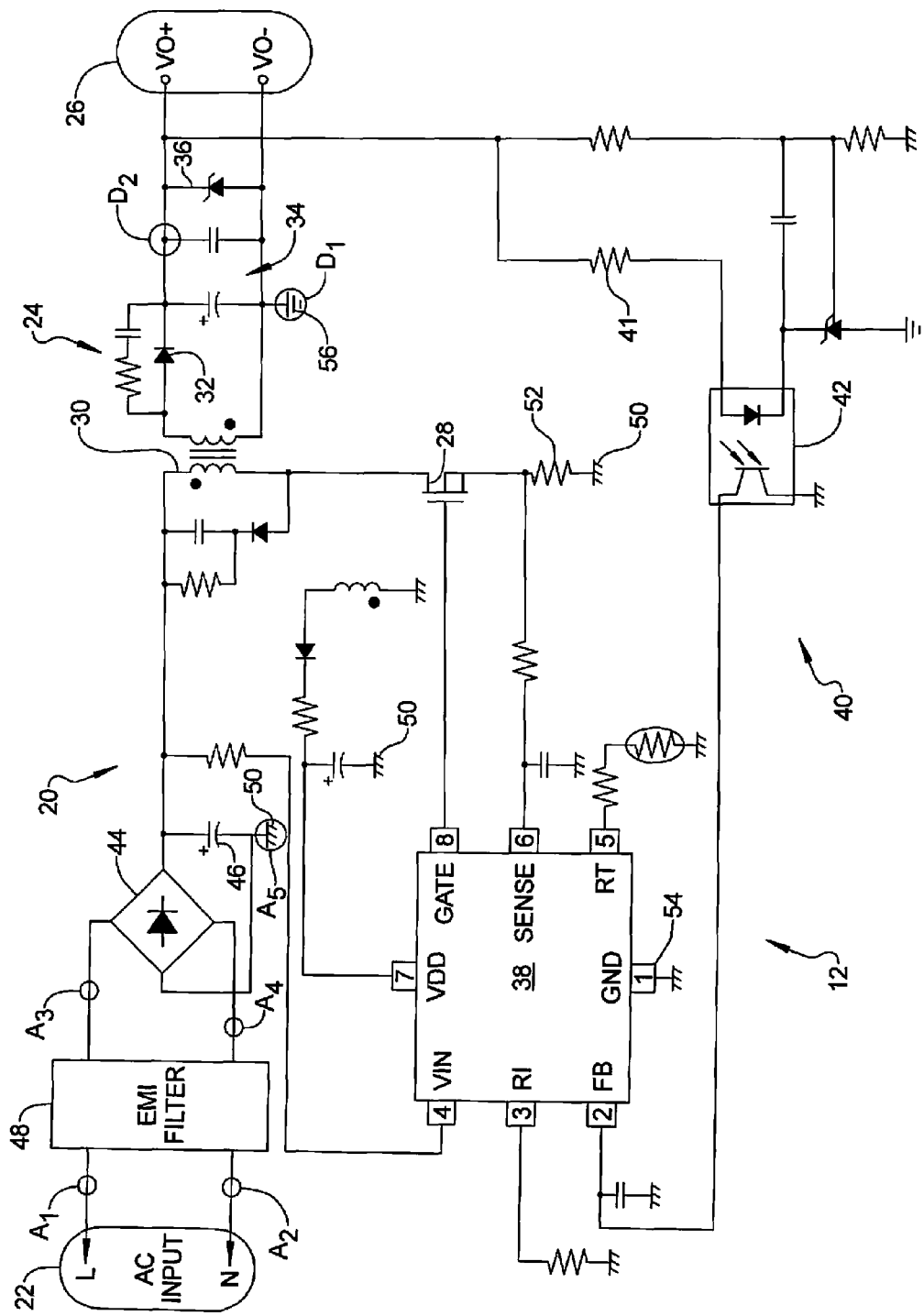
FIG. 2 is a simplified electronic circuit diagram of a switched mode power supply circuit.

By way of further explanation, FIG. 2 shows an exemplary switched mode power supply circuit in block diagram form. The power supply circuit includes an AC circuit portion 20 which is adapted for coupling to a source of alternating current as at AC input terminals 22. Terminals 22 are connected to a suitable power cord for connecting to an AC wall outlet. The power supply circuit also includes a DC circuit portion 24 having positive and negative DC terminals 26, which are then connected to the device being powered by the power supply. The power supply depicted in FIG. 2 is exemplary of a switching mode power supply that includes an active switching component 28 that produces a switched alternating current at a frequency higher than the frequency of the source of alternating current supplied by the wall outlet. As illustrated, the DC circuit portion and AC circuit portion are coupled together through a transformer 30, which provides the line of demarcation between the AC circuit portion and the DC circuit portion.

Transformer 30 is wound to act as a voltage step down transformer. A diode 32 for other suitable rectifier device converts the stepped-down voltage at the secondary side of transformer 30 into direct current which is then filtered by filter capacitors 34. A zener diode 36, or other suitable voltage regulating device, clamps the output DC voltage at the desired nominal operating voltage for the intended application.

In the illustrated embodiment, the active switching component 28 is driven by an electronic driver circuit 38. Circuit 38 forms part of a feedback circuit 40 that supplies control pulses to the active switching component 28 at the rate required to maintain the DC voltage output on terminals 26 at the desired voltage under different loads. The feedback circuit includes an optical coupler 42 which electrically isolates the DC circuit portion form the AC circuit portion The driver circuit 38 is powered by a DC supply voltage obtained using a bridge rectifier 44 and filter capacitor 46. It should be noted that the bridge rectifier 44 and filter capacitor 46 provide DC operating voltage to power the active switching component 28 and the driver circuit 38, although these components are on the AC circuit portion of the power supply.

An electromagnetic interference (EMI) filter 48 is included across the line (L) and neutral (N) sides of the AC input terminals to protect the circuit from voltage surges and electrical noise entering the circuit through the AC power cord.

The AC circuit portion 20 has an AC ground designated by the AC ground symbol 50, which appears at numerous points within the AC circuit portion 20. For example, one of the terminals of the bridge rectifier 44 is coupled to the AC ground as are a number of capacitors in the AC circuit potion. Likewise, the active switching component 28 coupled to AC ground 50 through a bias resistor 52; and driver circuit 38 is likewise referenced to circuit ground at its ground pin 54.

The DC circuit portion 24 has its own DC ground 56. A different symbol has been used for the DC ground to differentiate it from the AC ground in FIG. 2. Note that in the illustrated embodiment, the negative one of the DC terminals 26 is coupled to DC ground 56. It is also possible to construct a circuit with the opposite polarity, where the positive DC terminal is coupled to ground. Either option is possible depending on the requirements of the power device.

Figure 3:
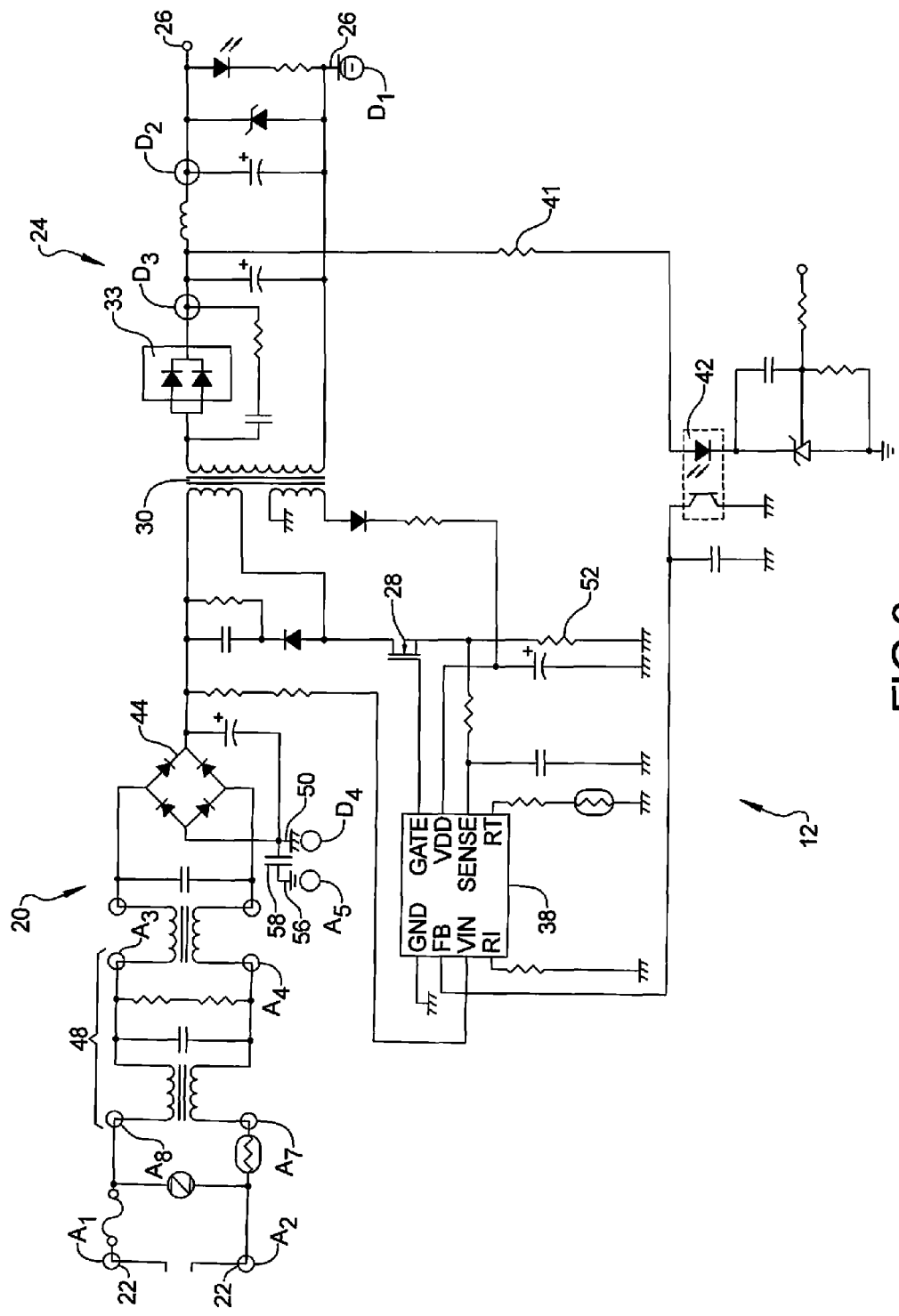
FIG. 3 is a detailed electronic circuit diagram of an exemplary switched mode power supply circuit.

FIG. 3 provides a more detailed circuit diagram of one embodiment of power supply. Where applicable, the same reference numerals as in FIG. 2 have been used to designate like or comparable components. As discussed in connection with FIG. 3, transformer 30 generally defines the line of demarcation between the AC circuit portion 20 and DC circuit portion 24.

By examining the circuit of FIG. 3 (and also the more generalized circuit of FIG. 2), it is seen that the AC and DC grounds are electrically isolated to substantially inhibit the flow of direct current there between. Because transformer 30 has separate primary and secondary windings, DC current on the secondary side of the transformer does not flow through to the primary side. Similarly, the DC voltage measured by feedback resistor 41 does not result in current flowing through the optical coupler 42, as this device is designed not to permit the flow of DC current through it. Careful inspection of the circuit of FIG. 3 shows that a capacitor 58 has been provided to couple between the AC ground 50 and the DC ground 56. Of course, this capacitor also blocks the flow of direct current between the AC ground and the DC ground.

Figure 5:
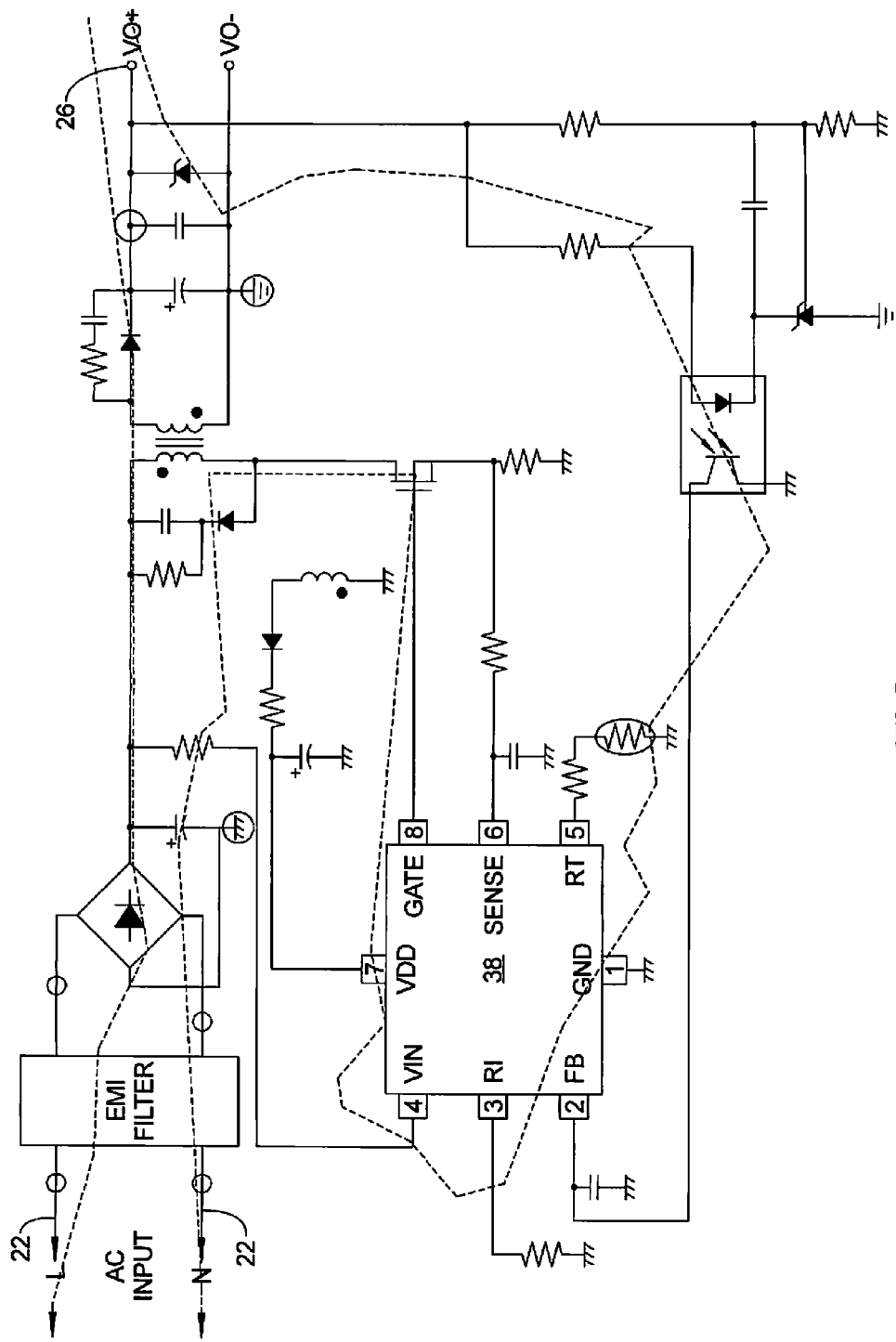
FIG. 5 is another view of the simplified electronic circuit diagram of FIG. 2, showing the discharge path of a static electric charge in a circuit without the benefit of the disclosed improvements.

When a static electricity charge enters the circuit of FIG. 3 at the DC terminals 26, significant damage to the power supply circuit can ensue as the charge races across the connected components in order to seek the lower potential of the AC input terminals 22. In this regard, because the AC input terminals are plugged into a power outlet, which is in turn coupled to the AC power grid, the static electric charge seeks to return to earth (to which the AC power grid is firmly rooted). Using the circuit of FIG. 2 as an example, FIG. 5 shows the exemplary paths by which the static electric charge travels en route from the DC terminals 26 to the AC terminals 22. As can be seen, this discharge path traverses many, if not all, of the delegate electronic circuits comprising the power supply. Because the circuits are not designed to operate at the elevated voltages produced by static electricity, permanent damage can be caused.

There are many ways that static electricity find its way into the delicate electronic components of the power supply 12. One very common way is that static electricity generated by persons as they walk across carpet or slide into and out of chairs and sofas. The effect is caused when two insulating objects, such as a person's clothing and the cloth covering a chair, are rubbed together. The effect is most prevalent at low humidity levels.

Figure 4:
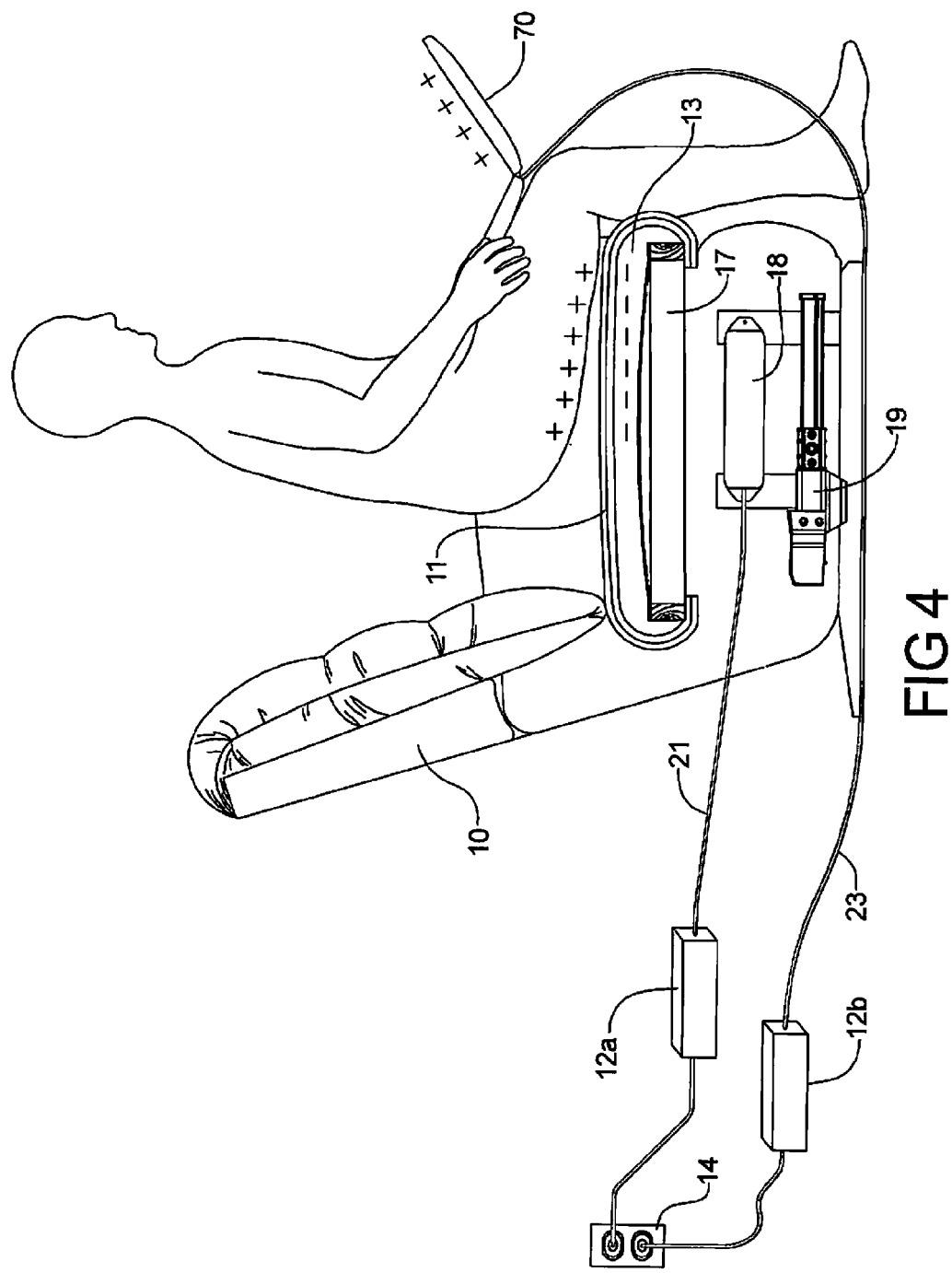
FIG. 4 is a cutaway side view of the chair of FIG. 1, illustrating how static electric charges are generated and propagate through the power supply coupled to the chair and also to other devices in contact with the user, such as a laptop computer.

FIG. 4 shows how static electricity can be generated and find its way into delicate power supply circuits where significant damage can be done. As illustrated in FIG. 4, a person seated in chair 10, holding laptop computer 70, slides forward to exit the chair. In so doing, the person's posterior rubs against the fabric of the chair 11, which causes a separation of positive (+) and negative (−) charges as the cloth of the person's clothing rubs against the cloth or other material from which the chair is made. Because the person's clothing, the chair fabric or other material are relatively poor conductors of electricity, a negative charge is stored in one material and a positive charge in the other. As illustrated in FIG. 4, the person's clothing is shown as having a positive charge, while the fabric of the chair is shown as having a negative charge. So long as the person remains seated, these positive and negative charges will be attracted to one another and thus will tend to remain in the localized region where the respective insulative surfaces touch one another. However, when the person stands up, these two insulating surfaces become separated and the respective positive and negative charges are no longer attracted to one another.

Thus, the chair in FIG. 4 becomes negatively charged while the person (and objects held by the person) become positively charged. In FIG. 4, the person is holding a laptop computer 70 and thus the laptop computer will also become positively charged.

Because both the chair 10 and the laptop computer 70 are coupled to their respective power supplies 12a and 12b, the static charges carried by the chair and carried by the person and laptop computer will flow towards the earth, which happens to be reachable via the AC power outlet 14. In this regard, it will be appreciated that the AC power outlet 14 is connected to the electric power grid maintained by the electric service utility company. This power grid is at many points carefully grounded to earth, thus the AC power outlet represents a very large earth sink to attract both positive and negative charges. Thus for example in FIG. 4, the negative (−) charges, initially deposited on the chair's cushion fabric 11, will flow through the cushion 13 and frame 17. From the frame, the charges then enter the control circuitry 17 and motor(s) 19. Because the control circuitry 17 is coupled to the power supply 12a, the charge follows the DC power supply leads 21 and thus enters the power supply 12 associated with the chair controller.

Similarly, as the person stands away from the chair, the positive (+) charges initially deposited on the person's clothing will flow into the laptop computer 70 and then follow the DC power supply leads 23 and thereby enter the power supply 12b of the laptop computer.

Figure 6:
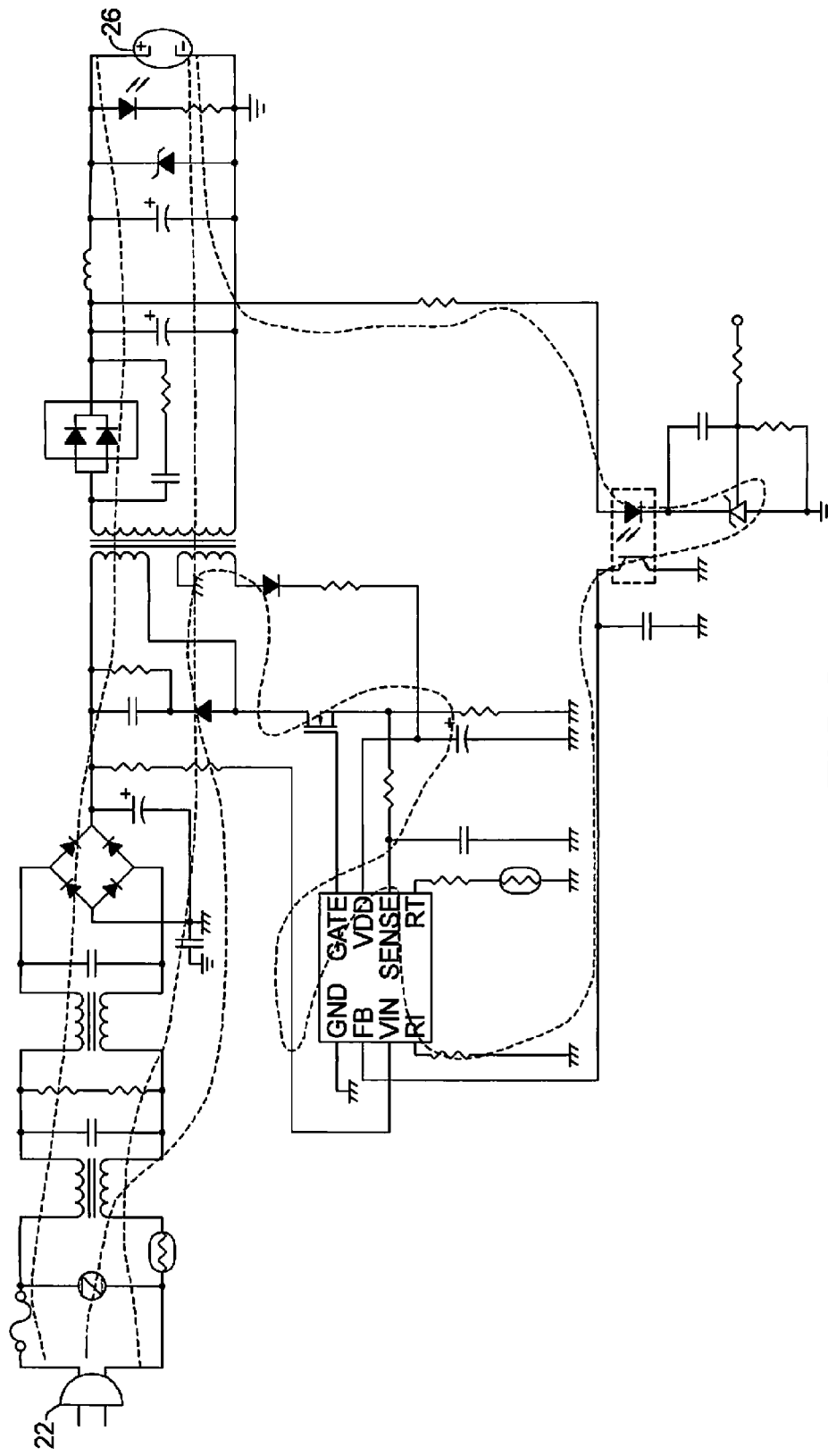
FIG. 6 is another view of the detailed electronic circuit diagram of FIG. 3, showing the discharge path of a static electric charge in a circuit without the benefit of the disclosed improvements.

Whether the charges are positive or negative, they will flow through the power supply circuits generally as illustrated in FIG. 5. Note that the electric charges enter the power supply circuit through the DC terminals 26 and then flow through many, if not all, of the delicate electronic components, ultimately exiting the power supply at the AC input terminals 22. In the case of the power supply associated with the chair 10, the static charge is a negative charge (based on the example of FIG. 4). In the case of the laptop computer 70 being held by the person, the charge would be a positive charge (based on the example of FIG. 4). In either case, these static charges will quickly pass through the respective power supply circuits, causing damage to the delicate electronics area. By way of further explanation, FIG. 6 shows the typical static electricity discharge path through the components of the power supply of FIG. 3.

To solve the static electricity discharge problem, the improved power supply circuit employs a static electricity discharge structure that routes the static electricity energy in a path that avoids the delicate electronic components. To implement this structure the circuit defines a first attachment point that provides an energy pathway to the AC ground, and a second attachment point that provides an energy pathway to the DC ground. To these first and second attachment points a spark gap structure is coupled. The spark gap structure is configured to provide a static electricity energy path between the first and second attachment points. The spark gap structure is itself configured to substantially inhibit the flow of direct current between the first and second attachment points (i.e., the spark gap structure does not create a short circuit between the first and second attachment points). FIGS. 7 and 8 diagrammatically illustrate this. Referring to FIG. 7, the AC circuit portion 20 has at least one attachment point 72 that provides an energy pathway to AC ground 50. Similarly, the DC circuit portion 24 has at least one attachment point 74 that provides an energy pathway 75 to DC ground 56. A spark gap structure 76 is coupled between the attachment points 72 and 74, as illustrated. In FIG. 7, the exemplary spark gap structure comprises one or a plurality of pairs of discharge pins 78 (three pairs are shown in FIG. 6). These discharge pins define an air gap having a separation distance between 2 mm and 8 mm, and preferably between 3 mm and 7 mm, with one presently preferred embodiment having a distance of 6.2 mm.

FIG. 8 shows an alternate embodiment where the spark gap structure 76 comprises a pair of conductive surfaces 80 that are spaced apart to define a separation distance of between 2 mm and 8 mm and preferably between 4 mm and 7 mm. These conductive surfaces may be implemented using metal components having other function within the circuit, such as a pair of spaced apart heat sinks, or a spaced apart set of wire leads on a circuit component such as a capacitor. Alternatively, the spark gap structure may be implemented using a gas discharge tube device.

In implementing the improved power supply circuit there can often be several different choices for implementing the first and second attachment points. Preferably the chosen are points are disposed on the respective AC circuit portions and DC circuit portions where active electronic components are not proximally attached. In FIG. 2, for example, suitable AC portion attachment points are designated as A1-A5 and suitable DC portion attachment points are designated as D1-D2. Being coupled between the respective AC portion and DC portion attachment points, he spark gap structure essentially routes the static electric discharge around the delicate electronic components. Thus a spark gap structure coupled between attachment points D2 and A1, for example, will route the static electric discharge energy directly from point D2 to point A1, bypassing all of the delicate electronic components in between. Other connections between attachment points D1 and/or D2 and one or more of points A1-A5 will accomplish the same circuit protection.

Figure 12:
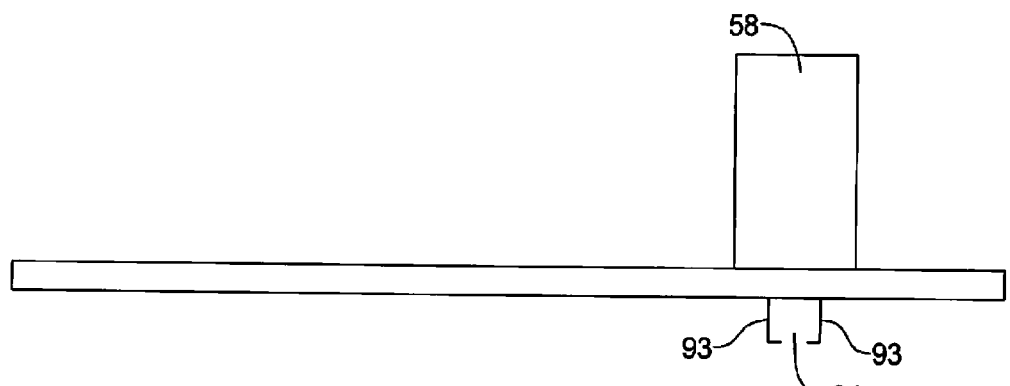
FIG. 12 is a detailed view of a power supply circuit component with leads configured in spaced relation to define a discharge gap.

FIG. 3 shows suitable attachment points for that circuit as well. These have been identified as points A1-A7 (on the AC circuit portion) and D1-D3 (on the DC circuit portion). Where applicable, like designations have been used to match those of FIG. 2. Because the circuit of FIG. 3 is more detailed than that of FIG. 2, more suitable attachment points have been shown. Of particular note are the attachment points A5 and D4. These correspond to the AC circuit portion side and DC circuit portion side of capacitor 58. While capacitor 58 appears in FIG. 3 to be within the AC circuit portion, it is actually serving to couple the AC ground with the DC ground. Thus capacitor 58 can be said to define a line of demarcation between the AC circuit portion and the DC circuit portion. As shown in FIG. 12, capacitor can be mounted on a circuit board or other suitable connection points, so that its leads extend outwardly and then inwardly to define a spark gap structure.

Figure 9:
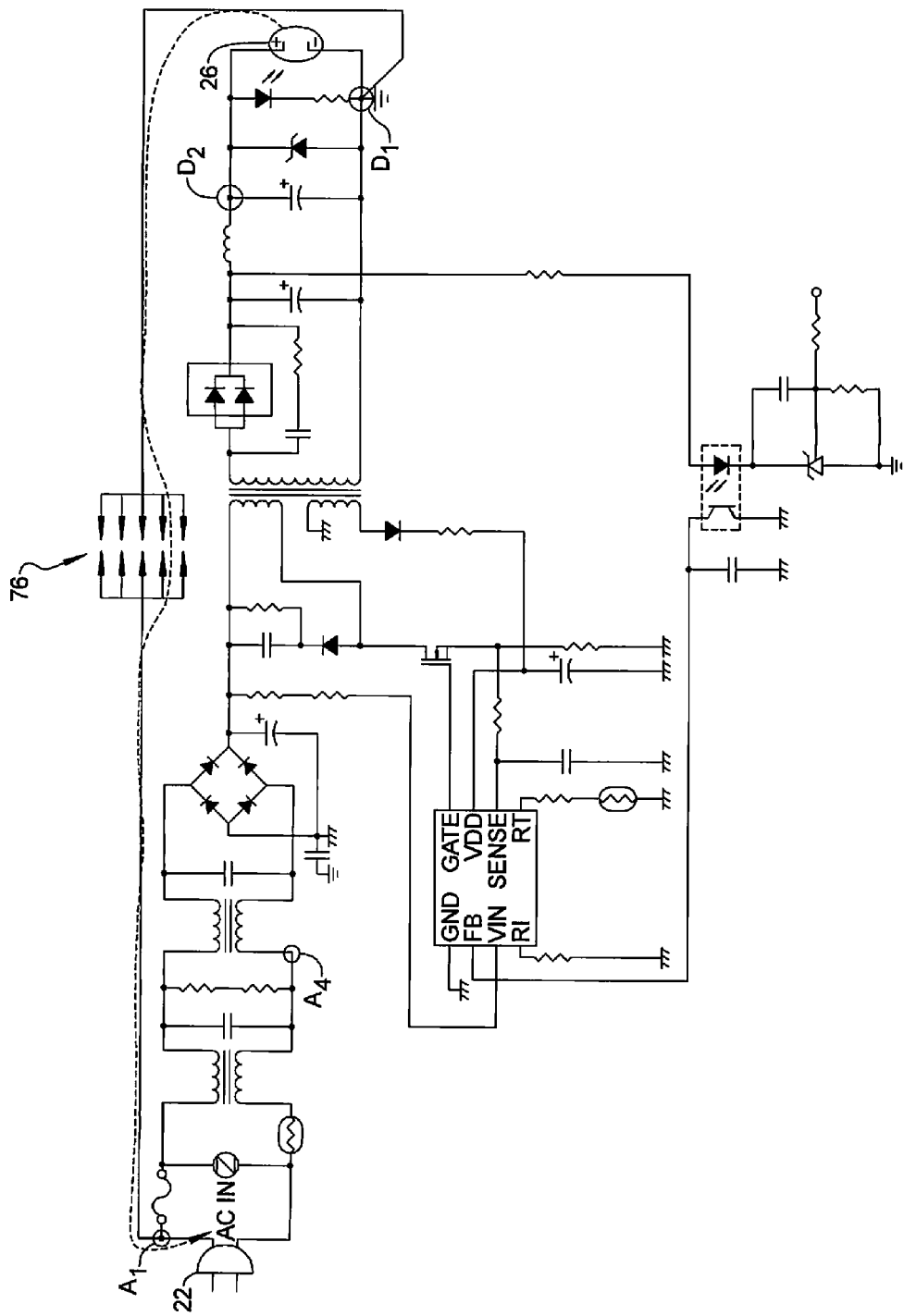
FIG. 9 is a detailed electronic circuit diagram of a power supply similar to that of FIG. 3, but including the spark gap structure of FIG. 7 and illustrating several different possible attachment points to which the spark gap structure may be coupled.

Referring now to FIG. 9, the circuit of FIG. 6 has been shown in modified form to include the spark gap structure 76 coupled between an AC circuit portion attachment point and a DC circuit portion attachment point. For illustration purposes, the attachment points A1 and D1 have been used. As can be seen, when electrostatic energy enters the DC terminals 26, the electrostatic energy is routed through the spark gap structure 76, bypassing all of the delicate electronic components. Compare this with FIG. 6, where the spark gap structure is not used and the electrostatic energy traverses all or most of the delicate electronic components, causing damage.

While one spark gap structure 76 comprising five pairs of discharge pins 78 has been illustrated in FIG. 9, it will be understood that the number of spark gap structures employed, and the number of individual pairs of discharge pins can be varied. For example, if desired a second spark gap structure might be coupled between attachment points A4 and D2, or between any other of the suitable AC circuit portion and DC circuit portion attachment points.

Figure 10:
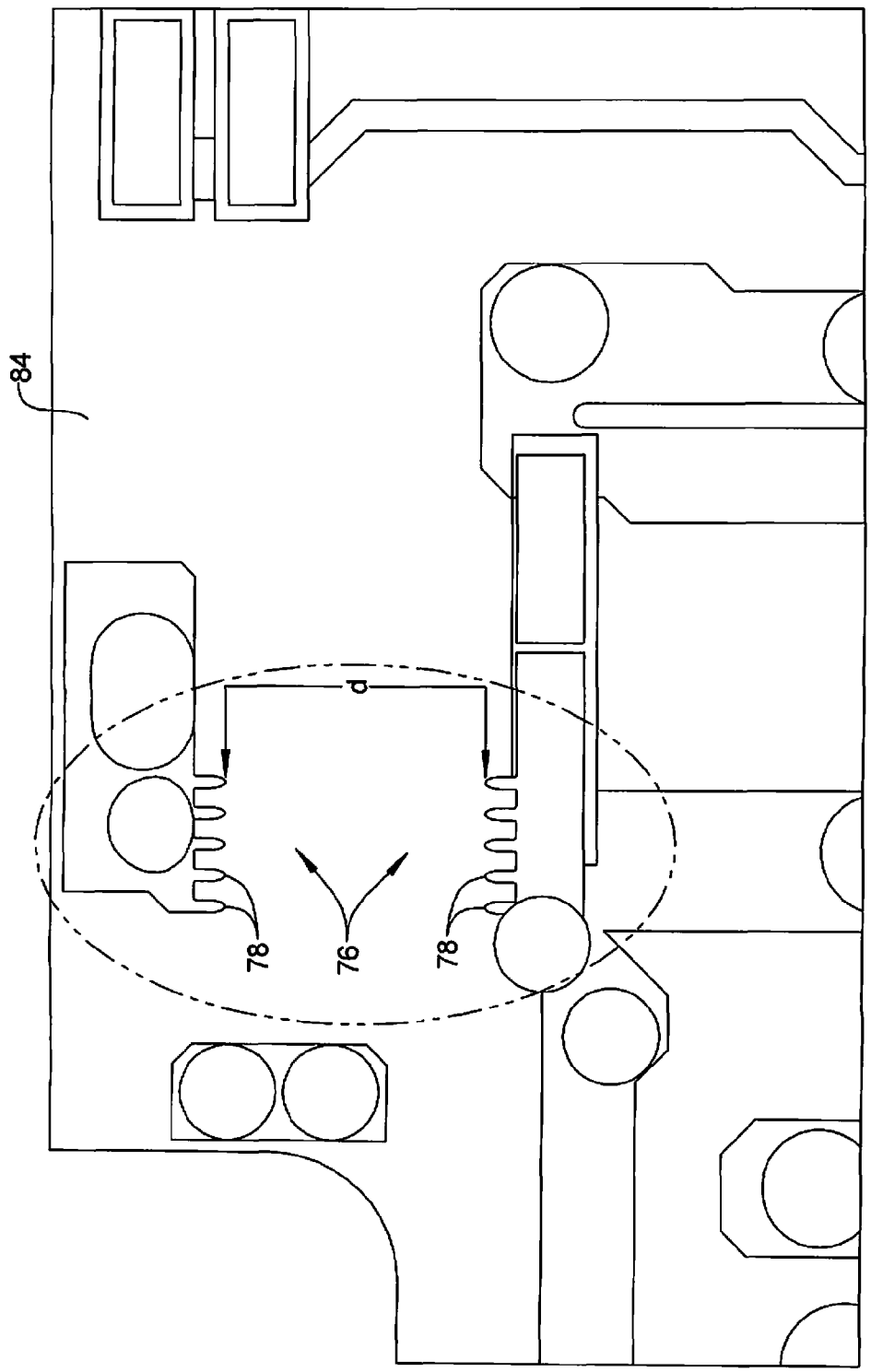
FIG. 10 is a partial plan view of a printed circuit board showing one embodiment of the spark gap structure employing discharge pins.

FIGS. 2 and 3 have illustrated some of the possible AC circuit portion and DC circuit portion attachment points, from the schematic diagram viewpoint. In an actual physical embodiment, the attachment points may be incorporated into regions or circuit traces of a printed circuit board to which the electronic components of the power supply are attached according to the schematic diagram. FIG. 10 shows how a spark gap structure 76 comprising plural pairs of discharge pins 78 can be manufactured as part of the printed circuit board. The plural pairs of discharge pins are separated to define a gap of distance d. In one embodiment the distance d is in a range between 4 mm and 7 mm, although a distance d is in a range between 2 mm and 8 mm may also be used. For example, in the embodiment shown in FIG. 10, which has been enlarged for ease of viewing, the distance d is 6.4 mm.

In this case, the metallic circuit traces are disposed on one side of the printed circuit board substrate 84. In this way, the metallic discharge pins are exposed to atmosphere so that static electricity can jump between the pairs of traces. In some circuit board manufacturing processes the circuit traces are coated with a protective, non-conductive coating. If such coating is provided, the regions around the metallic discharge pins should be masked when applying the coating, so that the discharge pins remain exposed to atmosphere to permit static discharge during use. While a single spark gap structure implemented as circuit board traces has been illustrated in FIG. 10, it should be understood that several such spark gap structures can be employed, and these can be coupled to the same attachment points or to different attachment points as may be dictated by physical or manufacturing constraints.

Figure 11:
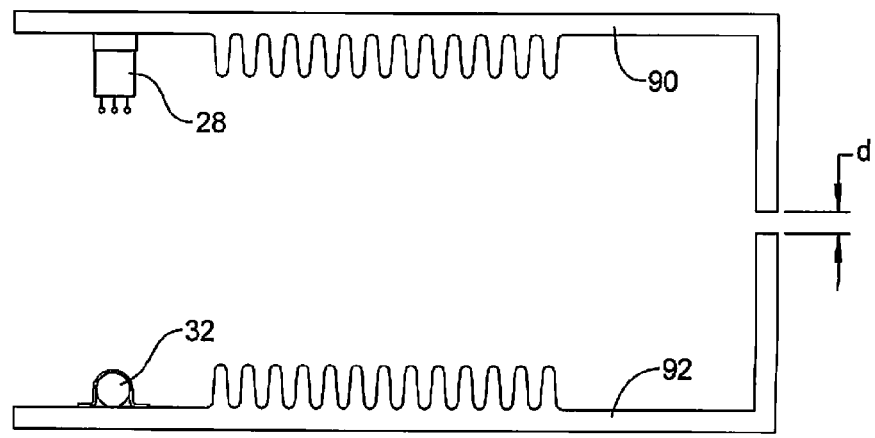
FIG. 11 is a partial plan view of a printed circuit board showing another embodiment of the spark gap structure employing spaced apart heat sinks.

Another alternate physical implementation for the spark gap structure is shown in FIG. 11. In this embodiment metal heat sinks are provided to dissipate heat from components on the respective AC and DC circuit portions. For example, on the AC circuit portion, the active switching component (e.g., component 28 of FIGS. 2 and 3) may be thermally coupled to heat sink 90. On the DC circuit portion the diode 32 may be thermally coupled to heat sink 92. These two heat sinks are then positioned as shown in FIG. 11, so that they define an air gap spacing d, sized as discussed above, so that the two heat sinks may serve as a spark gap structure. These heat sinks are electrically coupled to a suitable attachment point, such as those discussed above. In FIG. 11, heat sink 90 is electrically coupled to AC ground by being conductively attached to the AC side chassis to which all of the AC grounding points are attached. To prevent shorting of the active switching component 28, that a mica insulator (not shown) is used between component 28 and heat sink 90. In FIG. 11, heat sink 92 is conductively attached to attachment point D3, which is also electrically coupled to the cathode (negative terminal) of diode 32 (see FIGS. 2 and 3).

A third physical implementation for the spark gap structure is shown in FIG. 12. In this embodiment the two leads 93 of capacitor 58 are extended outwardly and bent inwardly, as shown, to form a spark gap as at 94. A fourth physical implementation, not shown, employs a gas discharge device coupled between the attachment points of respective AC and DC circuit portions.

While different physical implementations for the spark gap structure have been discussed separately, these different implementations can be used in combination if desired.

A method of configuring a protective circuit that inhibits the flow of ESD in a power supply that converts alternating current (AC) into direct current (DC) for powering device can also be carried out. Such a method can comprise the steps of:

providing an AC circuit adapted for coupling to a source of alternating current wherein the AC circuit has a first common reference point that defines an AC reference point;

providing a DC circuit coupled to the AC circuit wherein the DC circuit has direct current terminals for coupling to the powered device and has a second common reference point that defines a DC reference point;

establishing electrical isolation between the AC and DC reference points to substantially inhibit the flow of direct current there between;

providing a first attachment point that serves as an energy pathway to the AC reference point;

providing a second attachment point that serves as an energy pathway to the DC reference point; and creating a spark gap structure coupled to the first and second attachment points that is configured to substantially inhibit the flow of direct current between the first and second attachment points while providing a static electricity energy path between the first and second attachment points Alternatively, such a method can comprise the steps of:

providing an AC circuit adapted for coupling to a source of alternating current wherein the AC circuit has a first common reference point that defines an AC reference point;

providing a DC circuit coupled to the AC circuit wherein the DC circuit has direct current terminals for coupling to the powered device and has a second common reference point that defines a DC reference point;

establishing electrical isolation between the AC and DC reference points to substantially inhibit the flow of direct current there between;

providing a first attachment point defined on a printed circuit board that serves as an energy pathway to the AC reference point;

providing a second attachment point defined on a printed circuit board that serves as an energy pathway to the DC reference point; and creating at least one pair of spaced apart circuit traces, one trace of the pair being electrically connected to the first attachment point and the other trace of the pair being electrically connected to the second attachment point to serve as a spark gap structure coupled between the first and second attachment points and configured to substantially inhibit the flow of direct current between the first and second attachment points while providing a static electricity energy path between the first and second attachment points.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A power supply for converting alternating current (AC) into direct current (DC) for powering a device, the power supply comprising:

an AC circuit adapted for coupling to a source of alternating current and having a first common reference point that defines an AC reference point;

a DC circuit coupled to the AC circuit and providing direct current terminals for coupling to the powered device and having a second common reference point that defines a DC reference point;

the AC and DC reference points being electrically isolated to substantially inhibit the flow of direct current there between;

a first attachment point that provides an energy pathway to the AC reference point;

a second attachment point that provides an energy pathway to the DC reference point;

a spark gap structure coupled to the first and second attachment points, the spark gap structure being configured to substantially inhibit the flow of direct current between the first and second attachment points while providing a static electricity energy path between the first and second attachment points.

2. The power supply of claim 1 wherein the first and second attachment points are defined on a printed circuit board and where the spark gap structure comprises at least one pair of spaced apart circuit traces, one trace of the pair being electrically connected to the first attachment point and the other trace of the pair being electrically connected to the second attachment point.

3. The power supply of claim 2 wherein the pair of spaced apart circuit traces define an air gap having a separation distance of between 4 mm and 7 mm.

4. The power supply of claim 2 wherein the pair of spaced apart circuit traces define an air gap having a separation distance of between 2 mm and 8 mm.

5. The power supply of claim 2 wherein at least a portion of each of the pair of circuit traces is exposed to atmosphere.

6. The power supply of claim 1 wherein the AC circuit includes a metal heat sink structure attached to a component comprising the AC circuit and wherein said metal heat sink structure defines a portion of the spark gap structure.

7. The power supply of claim 1 wherein the DC circuit includes a metal heat sink structure attached to a component comprising the DC circuit and wherein said metal heat sink structure defines a portion of the spark gap structure.

8. The power supply of claim 4 wherein the AC circuit includes a second metal heat sink structure attached to a component comprising the AC circuit and wherein said second metal heat sink structure defines a second portion of the spark gap structure, the first and second heat sink structures being positioned in spaced relation to inhibit the flow of direct current between the first and second heat sink structures while providing a static electricity energy path there between.

9. The power supply of claim 8 wherein the first and second heat sink structures are spaced apart a separation distance of between 4 mm and 7 mm.

10. The power supply of claim 8 wherein the pair of spaced apart circuit traces define an air gap having a separation distance of between 2 mm and 8 mm.

11. The power supply of claim 1 wherein the spark gap structure comprises a capacitor connected to bridge between the AC circuit and the DC circuit, the capacitor having a pair of leads that are configured in spaced relation to define gap that provides a static electricity energy path.

12. The power supply of claim 11 wherein the defined gap is between 4 mm and 7 mm.

13. The power supply of claim 11 wherein the defined gap is between 2 mm and 8 mm.

14. The power supply of claim 1 wherein the spark gap structure comprises a gas discharge device that substantially impedes the flow of direct current while providing a static electricity energy path.

15. The power supply of claim 1 wherein the AC circuit and the DC circuit function as a switched mode power supply.

16. The power supply of claim 1 wherein the AC circuit includes at least one active switching component that produces a switched alternating current at a frequency higher than the frequency of the source of alternating current, wherein the DC circuit is coupled to the AC circuit through a transformer and wherein the DC circuit includes a rectifier that converts the switched alternating current into direct current.

17. The power supply of claim 1 wherein the AC circuit and the DC circuits are coupled by a transformer that defines a line of demarcation between the AC circuit and the DC circuit.

18. The power supply of claim 1 wherein the AC reference point is selected from the group consisting of AC ground, AC live and AC neutral.

19. The power supply of claim 1 wherein the DC reference point is selected from the group consisting of a DC positive terminal and a DC negative terminal.

20. A method of inhibiting the flow of electrostatic discharge in a power supply that converts alternating current (AC) into direct current (DC) for powering a device, the method comprising:

provinding an AC circuit adapted for coupling to a source of alternating current wherein the AC circuit has a first common reference point that defines an AC reference point;

providing a DC circuit coupled to the AC circuit wherein the DC circuit has direct current terminals for coupling to the powered device and has a second common reference point that defines a DC reference point;

establishing electrical isolation between the AC and DC reference points to substantially inhibit the flow of direct current there between;

providing a first attachment point that serves as an energy pathway to the AC reference point;

providing a second attachment point that serves as an energy pathway to the DC reference point; and creating a spark gap structure coupled to the first and second attachment points that is configured to substantially inhibit the flow of direct current between the first and second attachment points while providing a static electricity energy path between the first and second attachment points.

21. The method of claim 20 wherein the first and second attachment points are defined on a printed circuit board and the spark gap structure comprises at least one pair of spaced apart circuit traces, one trace of the pair being electrically connected to the first attachment point and the other trace of the pair being electrically connected to the second attachment point.

22. The method of claim 21 wherein the pair of spaced apart circuit traces define an air gap having a separation distance of between 4 mm and 7 mm.

23. A method of inhibiting the flow of electrostatic discharge in a power supply that converts alternating current (AC) into direct current (DC) for powering a device, the method comprising:

providing an AC circuit adapted for coupling to a source of alternating current wherein the AC circuit has a first common reference point that defines an AC reference point;

providing a DC circuit coupled to the AC circuit wherein the DC circuit has direct current terminals for coupling to the powered device and has a second common reference point that defines a DC reference point;

establishing electrical isolation between the AC and DC reference points to substantially inhibit the flow of direct current there between;

providing a first attachment point defined on a printed circuit board that serves as an energy pathway to the AC reference point;

providing a second attachment point defined on a printed circuit board that serves as an energy pathway to the DC reference point; and creating at least one pair of spaced apart circuit traces, one trace of the pair being electrically connected to the first attachment point and the other trace of the pair being electrically connected to the second attachment point to serve as a spark gap structure coupled between the first and second attachment points and configured to substantially inhibit the flow of direct current between the first and second attachment points while providing a static electricity energy path between the first and second attachment points.

24. The method of claim 23 wherein the pair of spaced apart circuit traces define an air gap having a separation distance of between 2 mm and 8 mm.

25. The method of claim 23 wherein at least a portion of each of the pair of circuit traces is exposed to atmosphere.

* * * * *